(12) United States Patent
Drapeau et al.

(10) Patent No.: US 6,307,446 B1
(45) Date of Patent: Oct. 23, 2001

(54) PLANAR INTERCONNECTS USING COMPRESSIBLE WIRE BUNDLE CONTACTS

(75) Inventors: David J. Drapeau, Los Angeles; Christopher A. Moye, El Segundo, both of CA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/395,472

(22) Filed: Sep. 14, 1999

(51) Int. Cl.$^7$ ................................................. H01P 1/04
(52) U.S. Cl. ................................................. 333/33; 333/260
(58) Field of Search ................................................. 333/246, 260, 333/33

(56) References Cited

U.S. PATENT DOCUMENTS

| | | | |
|---|---|---|---|
| 5,552,752 | 9/1996 | Sturdivant et al. | 333/243 |
| 5,633,615 | 5/1997 | Quan | 333/33 |
| 5,668,509 | 9/1997 | Hoffmeister et al. | 333/33 |
| 5,675,302 | 10/1997 | Howard et al. | 333/243 |
| 5,689,216 | 11/1997 | Sturdivant | 333/33 |
| 5,703,599 | 12/1997 | Quan et al. | 342/368 |
| 6,028,498 | * 2/2000 | Bickford | 333/260 |

FOREIGN PATENT DOCUMENTS

| | | | |
|---|---|---|---|
| 256801 | * 10/1989 | (JP) | 333/246 |
| 293001 | * 11/1989 | (JP) | 333/260 |

OTHER PUBLICATIONS

Product Data Sheet for CIN ASPE Stacking Connector, Cinch Connectors, 7 pages, 1991.
Product Data Sheet for Gilbert GPO Interconnect System, Gilbert Engineering Co., Inc., 4 pages, 1992.

* cited by examiner

*Primary Examiner*—Benny Lee
(74) *Attorney, Agent, or Firm*—Leonard A. Alkov; Glenn H. Lenzen, Jr.

(57) ABSTRACT

A technique for providing an elastic RF interconnection between first and second planar conductors, which provides stress relief against mechanical and environment stresses. A length of a compressible wire bundle having first and second end portions is used as the elastic conductor. The first end portion is attached to an end of the first conductor. The second end portion is attached to an end of the second conductor. In a typical application, the first and second conductors are disposed on separate substrates, in turn mounted to a package surface.

25 Claims, 1 Drawing Sheet

PLANAR INTERCONNECTS USING COMPRESSIBLE WIRE BUNDLE CONTACTS

TECHNICAL FIELD OF THE INVENTION

This invention relates to RF interconnect structures for providing interconnection between two conductors, and more particularly to techniques for providing elastic planar interconnects between two conductors.

BACKGROUND OF THE INVENTION

The existing industry standard for planar interconnects between two conductors is by gold wire or gold ribbon connection. Where any independent movement of the conductors can occur due to mechanical and/or environmental stresses, a loop in the interconnecting medium must be made to allow for stress relief. The amount of loop stress relief must be proportional to the amount of movement of the conductors. Unfortunately looping stress relief in high frequency RF interconnecting medium causes an impedance mismatch that results in poor VSWR and degradation of RF performance. Variability also occurs in forming the looping RF interconnection that further degrades RF performance. The act of assembling looping gold interconnects is typically a manual process that is above and beyond the other processes that are required to assemble a microwave integrated circuit.

In some instances it is not possible to form a reliable RF interconnection at high frequencies using conventional techniques. When this occurs costly mitigation steps must be taken which add to the overall unit cost.

SUMMARY OF THE INVENTION

A method for providing an RF interconnection between first and second planar conductors is described, which provides stress relief against mechanical and environment stresses. The method includes:

providing a first conductor and a second conductor in a generally coplanar relationship, the first conductor having a first connection portion, the second conductor having a second connection portion, and wherein the first connection portion is separated from the second connection portion;

providing a length of a compressible wire bundle having first and second end portions;

attaching the first end portion to the first connection portion of the first conductor; and attaching the second end portion to the second connection portion of the second conductor.

In a typical application, the first and second conductors are disposed on separate substrates, in turn mounted to a package surface. The compressible wire bundle provides an elastic interconnection which provides stress relief against mechanical and environmental stresses to which the package is subjected.

According to another aspect of the invention, an RF circuit is described, and includes a first conductor and a second conductor disposed in a generally coplanar relationship, the first conductor having a first connection portion, the second conductor having a second connection portion, and wherein the first connection portion is separated from the second connection portion. An elastic RF interconnection is provided between the first and second conductors, the interconnection comprising an elastic conductor having first and second end portions, the first end portion attached to the first connection portion of the first conductor, the second end portion attached to the second connection portion of the second conductor.

BRIEF DESCRIPTION OF THE DRAWING

These and other features and advantages of the is present invention will become more apparent from the following detailed description of an exemplary embodiment thereof, as illustrated in the accompanying drawings, in which.

DETAILED DESCRIPTION OF THE PREFERRED EMBODIMENT

In accordance with an aspect of the invention, an elastic planar interconnect between two conductors is made using a compressible wire bundle that can support a very wide frequency bandwidth. The wire bundle is fabricated of a thin, gold plated, metal wire (usually tungsten or beryllium copper), which is wound up into a knitted, wire mesh structure, typically a cylindrical form. The wire bundle is attached between two planar conductors to provide a connection that is highly elastic. The elasticity enables the interconnect to maintain reliability even when used in environments where there is significant independent movement of the conductors such as when thermal expansion/contraction occurs.

Figure 1:
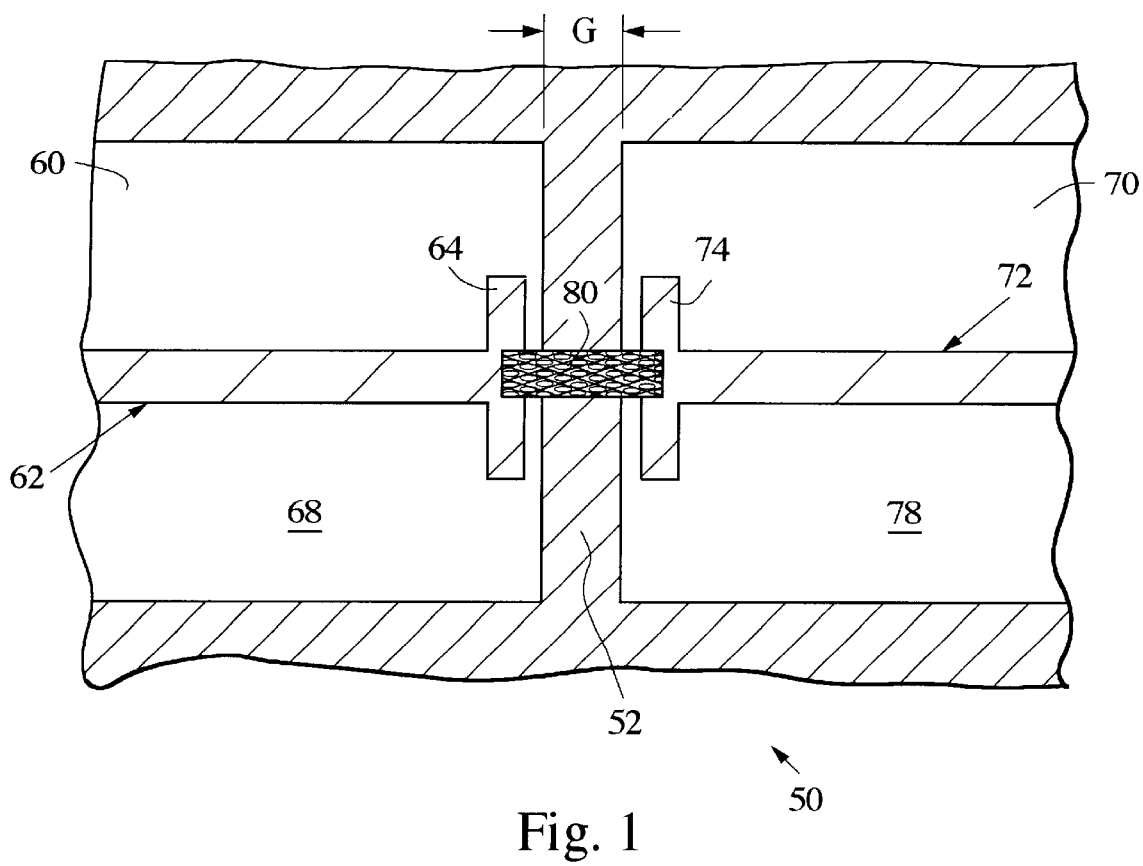
FIG. 1 is a top view of an RF circuit arrangement wherein an elastic interconnect in accordance with the invention is provided between two conductors.
Figure 2:
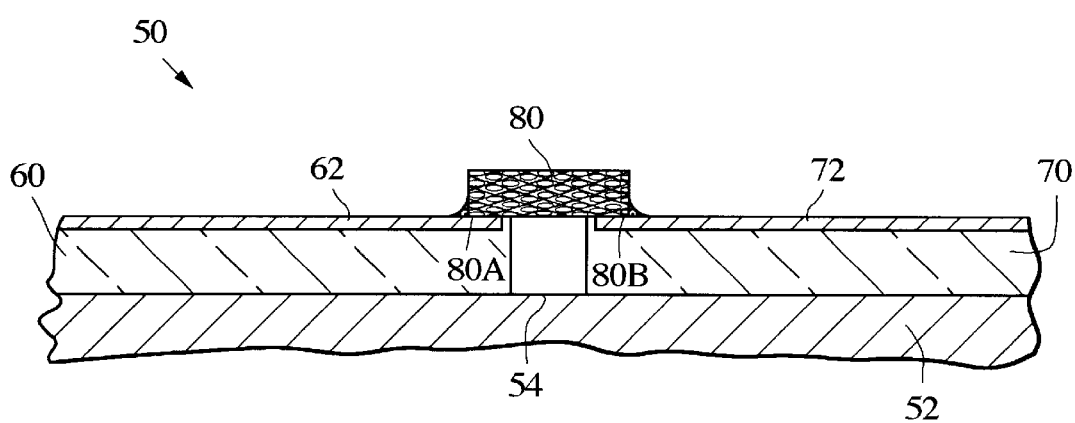
FIG. 2 is a side view of the circuit arrangement of FIG. 1.

An exemplary embodiment of the invention is shown in FIGS. 1 and 2. A microwave interconnect circuit 50 is illustrated, and includes a circuit package indicated generally as 52. A first dielectric substrate 60 is mounted on a planar surface 54 of the package. The substrate 60 has formed on top surface 68 by conventional photolithographic techniques a first conductor trace 62. A second dielectric substrate 70 is also mounted on the surface 54 of the package 52, and includes a second conductor trace 72, formed on top surface 78, which is collinear with the first trace 62 in this exemplary embodiment. The adjacent edges of the two substrates are separated by a gap G, in an exemplary embodiment on the order of 30 mils, but could be smaller or greater gap sizes in dependence on particular application requirements. In such cases, the elastic conductor length is selected to be shorter or longer as needed.

An exemplary embodiment of the invention is shown in FIGS. 1 and 2. A microwave interconnect circuit 50 is illustrated, and includes a circuit package indicated generally as 52. A first dielectric substrate 60 is mounted on a planar surface 54 of the package. The substrate 60 has formed on top surface 68 by conventional photolithographic techniques a first conductor trace 62. A second dielectric substrate 70 is also mounted on the surface 54 of the package 52, and includes a second conductor trace 72, which is collinear with the first trace 62 in this exemplary embodiment. The adjacent edges of the two substrates are separated by a gap G, in an exemplary embodiment on the order of 30 mils, but could be smaller or greater gap sizes in dependence on particular application requirements. In such cases, the elastic conductor length is selected to be shorter or longer as needed.

In the assembly process of mounting the substrates 60, 70 on the package surface, e.g. by epoxy, there is some tendency for the substrates to float and move about until the epoxy cures. A spacer element can be placed between the substrates during the assembly process to regulate the gap size. There are typical assembly tolerances which affect the X, Y and Z positioning of the substrates relative to each other. Thus, the heights of the substrate surfaces can vary from 5 mils to 10 mils in an exemplary assembly from true coplanar relationships. Further, the traces may vary from true colinearity for the same reason by 10 mils to 15 mils. Thus, it is to be understood that the exemplary embodiment is described in the context of coplanar substrate surfaces with collinear traces, but typical assembly tolerances with result in departure from colinearity and coplanarity. Further, the invention can provide acceptable performance between conductor traces which are not collinear or coplanar, by significant amounts.

In accordance with the invention, a compressible wire bundle 80 is attached between the two planar conductors 62, 72 to provide an RF connection that is highly elastic. The RF interconnection between the two conductors 62, 72 is operable even if the gap G size changes due to thermal expansion/contraction or mechanical stresses. In an exemplary embodiment, the bundle 80 has a generally cylindrical configuration, with a diameter of 15 mils to 20 mils, and a length of 50 mils to 70 mils. The particular diameter can depend on the frequency range of operation of the interconnect. Wire bundles suitable for the purpose are commercially available, e.g., an EMI shielding product marketed by Tecknit, 129 Dermody Street, NJ 07026.

The wire bundle 80 can be attached to the respective conductors 62, 72 by conductive epoxy, solder, welding, or other conventional attachment techniques. For example, the wire bundle can be put down with welding techniques at the same time as other interconnects are placed for the circuit, or it can be placed as a component using solder or conductive epoxy. The wire bundle is attached at respective attachment areas 80A, 80B, disposed on the cylindrical peripheral contour of the bundle adjacent the ends of the wire bundle. The longitudinal axis of the wire bundle then extends generally parallel to the conductors 62 and 72.

A short transverse conductor trace segment 64 is disposed at the connection end of the conductor trace 62. Similarly, a short transverse conductor trace segment 74 is disposed at the connection end of the conductor trace 72. The transverse segments 64, 74 are for matching purposes to tune out the inductance of the interconnect 80, and act as matching stubs, so that a 50 ohm impedance is maintained through the interconnect. The use of such transverse conductor segments is known for impedance matching of looped ribbon interconnects.

The planar interconnect using a compressible wire bundle provides an elastic interconnect between planar conductors that can support a broad frequency bandwidth, e.g. between 2 Ghz and 18 Ghz or higher. The interconnect has high elasticity that enables it to absorb large amounts of independent movement between conductors that can occur from thermal cycling and other mechanical stresses. The interconnect can be easily assembled at the same time and with the same processes as other discrete components with a variety of common hybrid assembly techniques that include conductive epoxy, solder, welding, and thermal compression/ultrasonic bonding.

One of the most beneficial features of the invention is the frequency range of usage. The interconnect can be easily designed to offer high uniformity low VSWR RF connections at frequencies to 40 GHz. The interconnect in accordance with aspects of this invention provides excellent RF and mechanical performance, and offers a lower cost of assembly than conventional planar interconnect techniques.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A method for providing a high uniformity, low VSWR RF interconnection over a broad RF frequency range, comprising:

providing a first conductor and a second conductor in a generally coplanar relationship, the first conductor having a first connection portion, the second conductor having a second connection portion, and wherein the first connection portion is separated from the second connection portion;

providing a length of an elastic conductor having first and second end portions, wherein the elastic conductor is a compressible wire bundle;

attaching the first end portion to the first connection portion of the first conductor; and attaching the second end portion to the second connection portion of the second conductor.

2. The method of claim 1 wherein the elastic conductor has a generally cylindrical configuration.

3. The method of claim 2, wherein the elastic conductor has a length in the range of 50 mils to 70 mils, and a diameter in the range of 15 mils to 20 mils.

4. The method of claim 1 wherein the first conductor and the second conductor are collinear.

5. The method of claim 1 wherein the length of an elastic conductor has an outer peripheral contour extending in parallel to a wire bundle longitudinal axis, and wherein the first end portion and the second end portion are respectively disposed on said outer peripheral contour at spaced locations.

6. The method of claim 5 wherein the first conductor and the second conductor are collinear, and the length of an elastic conductor is disposed in a generally parallel orientation relative to the first conductor and the second conductor.

7. The method of claim 1 wherein said step of providing the first conductor and the second conductor includes providing the first conductor on a first substrate, providing the second conductor on a second substrate, and mounting the first and second substrates on a mounting surface in a spaced relationship.

8. The method of claim 1 wherein said step of attaching of said first end portion and said attaching of said second end portion is by welding, use of conductive epoxy or soldering.

9. The method of claim 1 wherein said first connection portion of said first conductor is disposed adjacent a first end of said conductor, and said second connection portion of said second conductor is disposed adjacent a first end of said second conductor.

10. The method of claim 1 wherein the length of an elastic conductor is in a generally linear configuration after said attaching of said first end portion and said attaching of said second end portion.

11. The method of claim 1, wherein the RF frequency range is between 2 Ghz and 18 Ghz or higher.

12. An RF circuit, comprising:

a first conductor and a second conductor disposed in a generally coplanar relationship, the first conductor having a first connection portion, the second conductor having a second connection portion, and wherein the first connection portion is separated from the second connection portion;

an elastic RF interconnection between the first and second conductors, the RF interconnection for providing a high uniformity, low VSWR RF connection between the first and second conductors over a broad RF frequency range, the RF interconnection comprising an elastic conductor having first and second end portions, the first end portion attached to the first connection portion of the first conductor, the second end portion attached to the second connection portion of the second conductor, wherein the elastic conductor is a length of a compressible wire bundle.

13. The circuit of claim 12 wherein the elastic conductor is in a generally linear configuration.

14. The circuit of claim 12 wherein the first conductor and the second conductor are collinear.

15. The circuit of claim 12 wherein the elastic conductor has an outer peripheral contour extending in parallel to an elastic conductor longitudinal axis, and wherein the first end portion and the second end portion are respectively disposed on said outer peripheral contour at spaced locations.

16. The circuit of claim 15 wherein the first conductor and the second conductor are collinear, and the elastic conductor is disposed in a generally parallel orientation relative to the first conductor and the second conductor.

17. The circuit of claim 12 wherein the first conductor is disposed on a first substrate, the second conductor is disposed on a second substrate, and the first and second substrates are mounted on a mounting surface in a spaced relationship.

18. The circuit of claim 12 wherein said first end portion and said second end portion are attached to said respective first and second conductors by welds, conductive epoxy or solder.

19. The circuit of claim 12 wherein said first connection portion of said first conductor is disposed adjacent a first end of said conductor, and said second connection portion of said second conductor is disposed adjacent a first end of said second conductor.

20. The circuit of claim 12 wherein the elastic conductor has a generally cylindrical configuration.

21. The circuit of claim 20 wherein the elastic conductor has a length in the range of 50 mils to 70 mils, and a diameter in the range of 15 mils to 20 mils.

22. The circuit of claim 12, wherein the RF frequency range is between 2 Ghz and 18 Ghz or higher.

23. An RF circuit, comprising:

a first substrate mounted on a mounted surface and having a first conductor disposed on a surface of the first substrate;

a second substrate mounted on the mounting surface spaced from the second substrate and having a second conductor disposed on a surface of the second substrate, the first and second conductors in a generally coplanar and collinear relationship;

the first conductor having a first connection portion;

the second conductor having a second connection portion; and wherein the first connection portion is separated from the second connection portion;

an RF interconnection between the first and second conductors, the interconnection comprising a length of a compressible wire bundle having first and second end portions, the first end portion attached to the first connection portion of the first conductor, the second end portion attached to the second connection portion of the second conductor, the length of the wire bundle extending generally parallel to the first and second conductors.

24. The circuit of claim 23, wherein the RF interconnection provides a high uniformity, low VSWR interconnection over an RF frequency range between 2 Ghz and 18 Ghz or higher.

25. The circuit of claim 24, wherein the elastic conductor has a generally cylindrical configuration with a length in the range of 50 mils to 70 mils, and a diameter in the range of 15 mils to 20 mils.

\* \* \* \* \*